(12) United States Patent
McQuilkin et al.

(10) Patent No.: US 11,686,773 B1
(45) Date of Patent: Jun. 27, 2023

(54) PATH LOSS COMPENSATION FOR COMPARATOR

(71) Applicant: Analog Devices, Inc., Wilmington, MA (US)

(72) Inventors: Christopher C. McQuilkin, Hollis, NH (US); Andrew Nathan Mort, Wexford, PA (US)

(73) Assignee: Analog Devices, Inc., Wilmington, MA (US)

( * ) Notice: Subject to any disclaimer, the term of this patent is extended or adjusted under 35 U.S.C. 154(b) by 13 days.

(21) Appl. No.: 17/584,211

(22) Filed: Jan. 25, 2022

(51) Int. Cl.
| | |
|---|---|
| G01R 31/02 | (2006.01) |
| G01R 31/26 | (2020.01) |
| G01R 31/319 | (2006.01) |
| G01R 31/28 | (2006.01) |
| H01L 21/66 | (2006.01) |

(52) U.S. Cl.
CPC ... *G01R 31/31924* (2013.01); *G01R 31/2831* (2013.01); *G01R 31/2884* (2013.01); *G01R 31/2886* (2013.01); *G01R 31/3191* (2013.01); *H01L 22/34* (2013.01); *H01L 2924/00* (2013.01); *H01L 2924/0002* (2013.01)

(58) Field of Classification Search
CPC .......... G01R 31/31924; G01R 31/3191; G01R 31/2884; G01R 31/2886; G01R 31/2831; H01L 2924/00; H01L 2924/0002; H01L 22/34
USPC ......... 324/71, 340, 361, 378, 403, 415, 425, 324/500, 537, 762.01
See application file for complete search history.

(56) References Cited

U.S. PATENT DOCUMENTS

| | | |
|---|---|---|
| 6,134,373 A | 10/2000 | Strolle et al. |
| 7,120,840 B1 | 10/2006 | Shimanouchi |
| 7,174,143 B1 | 2/2007 | Turvey |
| 7,199,604 B2 | 4/2007 | Hecht et al. |
| 7,248,035 B2 | 7/2007 | Babcock et al. |
| 7,408,337 B2 | 8/2008 | Persons |
| 7,672,805 B2 | 3/2010 | Kushnick et al. |
| 7,800,912 B2 | 9/2010 | Nakamura et al. |
| 7,834,639 B2 | 11/2010 | Ichiyama et al. |
| 7,904,776 B2 | 3/2011 | Ichiyama et al. |
| 7,990,177 B2 | 8/2011 | Matsumoto et al. |
| 7,994,807 B1 | 8/2011 | Koh et al. |
| 8,239,147 B2 | 8/2012 | Watanabe et al. |
| 2006/0195749 A1* | 8/2006 | Cohen ................ G01R 31/3191 714/742 |
| 2009/0146677 A1* | 6/2009 | Matsumoto ...... G01R 31/31924 324/754.07 |
| 2010/0190448 A1* | 7/2010 | Kuwana ............. G01R 31/3191 455/63.1 |

(Continued)

*Primary Examiner* — Raul J Rios Russo
(74) *Attorney, Agent, or Firm* — Schwegman Lundberg & Woessner, P.A.

(57) ABSTRACT

A test system can receive a test signal from a device under test (DUI) via a first signal path. A comparator circuit can receive the test signal and, in response, generate an intermediate output signal based on a magnitude relationship between the test signal a comparator reference signal. A compensation circuit can generate a correction signal that is complementary to a portion of the received test signal, such as to correct for loading effects of the first signal path. The test system can include an output circuit configured to provide a corrected differential output signal that is based on a combination of the intermediate output signal and the correction signal.

20 Claims, 7 Drawing Sheets

(56) References Cited

U.S. PATENT DOCUMENTS

2020/0081039 A1  3/2020  Kim et al.

* cited by examiner

PATH LOSS COMPENSATION FOR COMPARATOR

BACKGROUND

A test system for electronic device testing can include a pin driver circuit that provides a voltage test pulse to a device under test (DUT). In response, the test system can be configured to measure a response from a DUT, such as to determine whether the DUT meets one or more specified operating parameters. A test system can optionally include multiple driver circuits, such as a class AB driver circuit and a class A driver circuit to provide circuit test signals having different amplitude or timing characteristics. In an example, the test system is configured to measure a response from a DUT using an active load and a comparator circuit to sense transitions at a DUT pin.

A system for testing digital integrated circuits (ICs) can include a driver circuit configured to provide multiple voltage levels (e.g., Vhigh, Vlow and Vterm) to a DUI. The DUT can exhibit bidirectional (I/O) capability in that it can both source and receive stimulus. The driver circuit's Vhigh and Vlow levels serve to stimulate a DUT while in its "input" state, and Vterm acts as a termination for the DUT in its "output" state. The process of switching between Vlow, and Vterm can be conceptualized as a collection of three switches, with one terminal of each switch connected to either Vhigh, Vlow, or Vterm, and the other terminal connected to a 50 ohm resistor, which is then connected to the DUT node. Transitions between the three levels can be realized by opening and closing the appropriate switches, such as with only one switch closed at any given time.

Various comparator circuit structures have been proposed. Some have enhanced latching accuracy or enhanced bandwidth capabilities for operations such as high-speed sampling in applications including analog-to-digital converters or automated test equipment (ATE). In an example, a comparator circuit includes an AC input node, a DC input node, and an output node. In an example that includes a comparator in a circuit configured to execute automated testing of a DUT, the AC input node can be coupled to a DUT interface node, and the DC input node can be coupled to a reference node to receive a reference voltage signal. Signal changes at the output node of the comparator circuit can provide information about a relationship between the DUT output and the reference voltage signal.

BRIEF SUMMARY

The present inventors have recognized, among other things, that a problem to be solved includes providing an automated test system to measure response signals from a device under test (DUT). The problem can include providing a system that is relatively small, inexpensive to produce, consumes less power than traditional systems, or provides higher fidelity performance relative to traditional systems. In an example, the problem can include providing a system with a comparator having a constant, input invariant propagation delay. The problem can further include artifacts of physical signal systems that can lead to or cause signal corruption. For example, sources of corruption can include skin effect losses, dielectric loading, conductor resistance and waveform reflections, and more. Such signal corruption sources can contribute to undesirable changes to a DUT signal when the signal travels between the DUT and, for example, a comparator configured to measure changes in the DUT signal. The undesirable changes in the DUT signal can contribute to signal timing errors due to propagation delays that, in turn, can lead to false or erroneous test results.

In an example, a solution to these and other problems can include or use a comparator circuit or comparator stage of an automated test equipment (ATE) system with a loss compensation circuit. The present inventors have recognized that the loss compensation circuit can be configured to address signal errors, such as due to conductor or path loading, which can be characterized and quantified. For example, scattering parameters, or S-parameters, can be measured to describe the non-ideal electrical behavior of a signal path that extends between a DUT output node and a comparator circuit input node. The loss compensation circuit can include a filter, based on the measured S-parameters, that represents an inverse function of the non-ideal electrical behavior of the signal path. The filter can then be used to generate a compensation signal that can be summed, for example with a comparator input signal, to provide a corrected output signal. That is, the filter can provide a correction signal that serves as an inverse response of the lossy input path, and the correction signal can be summed with the input signal to correct it.

In an example, a solution to the above-mentioned problems can include a test system comprising a first differential pair circuit configured to generate an intermediate output signal that is based on a relationship between a test signal received from a device under test (DUT) and a reference signal (Vth). The test system can further include a path loading compensation circuit configured to generate an AC-coupled correction signal that compensates for losses in the received test signal. In an example, the compensation circuit comprises a transconductance stage configured to provide a DC-coupled intermediate signal to a gain stage, and the compensation circuit further comprises a signal shaping filter stage configured to provide the correction signal based on an output signal from the gain stage. The test system can further include an output circuit configured to provide a corrected output signal based on a superposition or combination of the intermediate output signal and the correction signal.

In an example, a solution to the above-mentioned problems can include a method comprising receiving a test signal from a device under test (DUT) at an input node of a comparator, generating an intermediate output signal based on a relationship between the test signal from the DUT and a comparator reference signal (Vth), providing a DC-coupled signal based on the relationship between the test signal from the DUT and the comparator reference signal, generating an AC-coupled correction signal using the DC-coupled signal, the correction signal providing an inverse response to the lossy input signal path and applied to a portion of the received test signal, and then providing a corrected output signal based on a combination of the intermediate output signal and the correction signal.

This summary is not intended to provide an exclusive or exhaustive explanation of the invention. The detailed description is included to provide further information about the present patent application.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
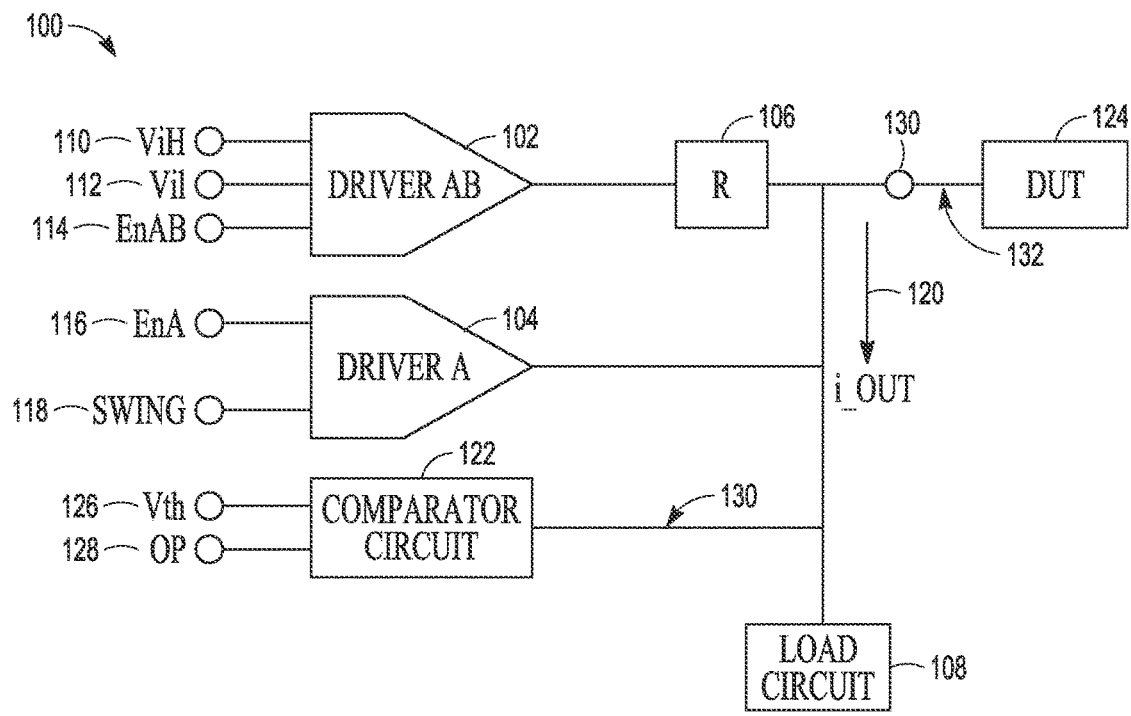
FIG. 1 illustrates generally an example of a test system topology including multiple driver circuits.

A test system can include a pin driver configured to provide a voltage pulse stimulus to a device under test (DUT) at a specified time, and the test system can include measurement circuitry for receiving and measuring a response signal from the DUT. The test system can be configured to provide high fidelity output signal pulses over a relatively large output signal magnitude range to accommodate different tests and different types of devices under test.

In an example, a test system can include a pin driver architecture that can provide high fidelity stimulus signals with minimal overshoot or spiking of high frequency current signals, and can maintain pulse edge placement accuracy and signal bandwidth at high or low power operating levels. In an example, a test system can include one or more driver stages, such as can include a class A driver stage or a class AB driver stage, such as can be configured to provide a variety of pulse signals. The systems can include control circuits to precisely control switching control voltage signals and switching current signals, and to control an operating mode and monitoring or measuring activity of a comparator.

In an example, multiple drivers or driver stages can be used to provide a test system that is configurable to test a variety of semiconductor devices with varying voltage and speed requirements. Furthermore, multiple drivers can be used to enhance or enable multiple signal level testing or "multiplexing" for physical layer testing. During physical layer testing, the multiple drivers can be switched concurrently to provide various different stimuli or drive signals to a DUT.

A test system can include a comparator circuit or comparator stage that is configured to receive high speed voltage or current response signals from a DUT. A comparator, generally, is a decision element that provides information about a relationship between at least two input signals. For example, a comparator can provide a digital output (e.g., a logic high or a logic low signal) that indicates a relationship between a signal from a DUT and a reference signal, such as a reference voltage signal. The comparator can include one or more gain stages, such as can be coupled in series, to yield a high gain response. In an example, offset errors such as due to path loading between the DUT and comparator can lead to processing errors, which in turn lead to test escapes or low yield.

In sonic examples, high speed automatic test equipment (ATE) systems have sufficiently high bandwidth that non-idealities in the transmission medium between the device under test (DUT) and the ATE pin electronics can contribute a significant limitation to overall system performance. This transmission medium, or path, generally comprises several cables, connectors, printed circuit board traces and "pogo pins" that electrically couple with the DUI. The losses associated with such components primarily manifest as the "skin effect" in which the resistance seen by the propagating signal is a function of signal frequency. Because every signal can be represented by a superposition of many frequency components, certain components of the signal suffer greater loss than others, thus producing a dispersive effect that degrades the received signal. If the original signal is to be presented to the pin electronics with minimal distortion, then great care must be taken in the design of the transmission path. In some cases, the frequency components present in high speed signals are so high that even the best quality transmission path can cause significant degradation in the signal integrity. In such cases the pin electronics receiver, typically a comparator, can include or use compensation circuitry to compensate for the expected transmission losses. Such circuitry can be included as a part of the pin electronics comparator, and is sometimes referred to as cable loss compensation.

Systems and methods described herein provide, among other things, a digitally-controlled comparator with a loss compensation circuit. The loss compensation circuit can generate a residue signal, or can extract a residue or error signal from an input signal, to provide a correction signal that can be combined with a DUT signal to correct signal fidelity and thereby help minimize timing errors due to path loading. Some examples herein include or show various comparators or comparator circuits in the context of a test system or ATE, however, other uses are also contemplated. In other words, the systems and methods discussed herein can apply in general to other receiver circuits that suffer from signal distortion in the receive transmission medium. Such circuits include differential receiver circuits in general, such as differential line receivers for clock or data recovery circuits, or telecommunication input circuits. ATE receivers can be considered as a special case of such differential receivers, with one signal (e.g., the DUT output) received via a transmission medium, and another signal (e.g., the reference signal) generated locally.

FIG. 1 illustrates generally a first example 100 of a test system topology including multiple driver stages and a comparator stage. The first example 100 includes a first DriverAB 102 that can include a class AB driver circuit, and a first DriverA 104 that can include a class A driver circuit. The first example 100 can further include an output element such as a first resistor 106 that can be configured to provide a specified output or load impedance. In an example, the first example 100 can include a comparator circuit 122, or a first load circuit 108, such as can include an active load or other loading device. In an example, the test system is configured to provide a first output current 120, i_OUT, at a DUT signal 130.

In an example, the first DriverAB 102 can be configured to produce a voltage stimulus signal by selecting between parallel-connected diode bridges with each bridge driven by a unique, dedicated DC voltage level. In the first example 100 of FIG. 1, DC voltages Vih 110 and Vil 112 drive diode bridges in the first DriverAB 102. The switching stage can be followed by a voltage buffering stage that can provide power gain, such as can be used to produce large currents to serve a 50 ohm DUT environment.

In contrast with the first DriverAB 102, the first DriverA 104 can be configured to produce transitions at the DUI signal 130 using a relatively large current switch stage that can be coupled directly to the DUT signal 130. A current switching stage in the first DriverA 104 can alternately switch current into and out of the DUT signal 130 in response to a control signal Swing 118, such as can be a voltage control signal. The first DriverA 104 can provide high speed operation, for example, because it may be unburdened by the class AB voltage buffering stage with its attendant bandwidth limitations and other performance limitations.

In an example, the first DriverA 104 can be configured to provide a relatively low amplitude signal at the DUT signal 130. For example, the first DriverA 104 can provide a signal having about a 2 volt swing, The first DriverAB 102 can be configured to provide a relatively high amplitude signal at the DUT signal 130, for example, −1.5 to +7 volts. The first DriverA 104 generally operates at a higher switching speed or bandwidth than the first DriverAB 102. In an example, the first DriverAB 102 can be configured to absorb switching currents from the first DriverA 104. That is, the first DriverAB 102 can serve as a buffer that the first DriverA 104 can source current into, such as through the first resistor 106.

One or both of the first DriverAB 102 and the first DriverA 104 can be selected to fulfill disparate DUT test requirements that may not otherwise be fulfilled by a single driver. For example, while both driver circuits can provide DUT waveforms, the first DriverAB 102 can be configured to provide large amplitude, low bandwidth stimulus signals, and the first DriverA 104 can be configured to provide low amplitude, high bandwidth stimulus signals.

In an example, the first DriverAB 102 and the first DriverA 104 do not share an enable pin. Instead, each driver circuit includes an independent enable control through pins EnAB 114 and EnA 116. The independent enable control facilitates the first DriverAB 102 to serve as a low speed, high voltage stimulus source, and to serve as a static, non-transitioning buffer to absorb switching currents from the first DriverA 104.

FIG. 1 includes the comparator circuit 122. The comparator circuit 122. can include a single-stage or multiple-stage comparator that is configured to receive a DUT signal 130 from the DUT 124, such as via the DUT signal 130 and a loaded signal path 132. The comparator circuit 122 can compare the received signals to a comparator reference signal 126 (e.g., Vth) and, in response, provide a differential comparator output signal 128 (e.g., OP). For example, the comparator circuit 122 can receive a voltage response signal from the DUT 124 and compare an amplitude of the voltage response signal to an amplitude of the comparator reference signal 126. The comparator circuit 122 can provide information about the amplitude relationship using the differential comparator output signal 128, such as can include a digital signal or logic output signal.

Figure 2:
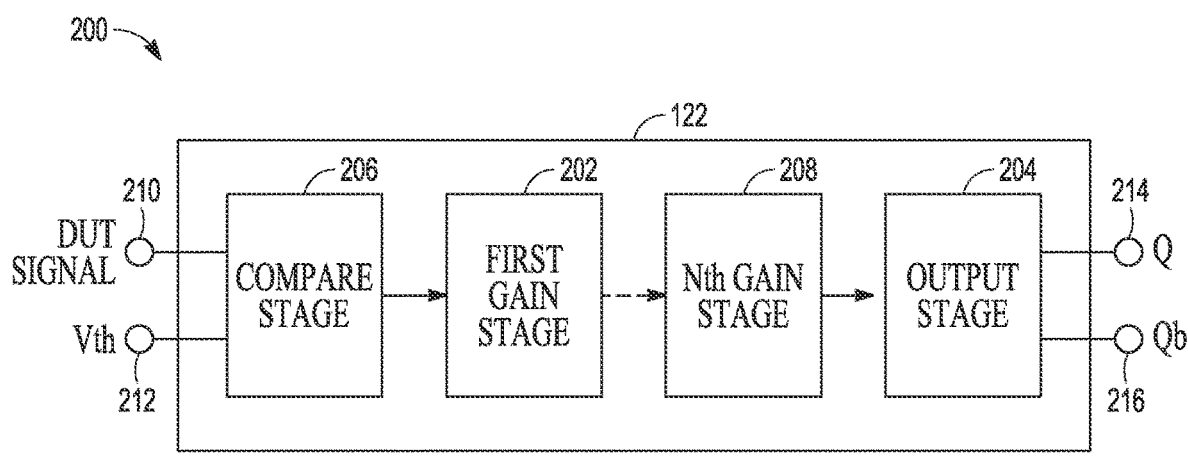
FIG. 2 illustrates generally an example of a comparator circuit.

FIG. 2 illustrates generally a comparator example 200 that can include the comparator circuit 122. The comparator circuit 122 can include a comparator input node 210, a reference signal input node 212, a first output node 214, and a second output node 216. The comparator circuit 122 can include multiple different circuit stages provided in series. For example, the comparator circuit 122 can include a compare stage 206, one or more gain stages, such as a first gain stage 202 through an nth gain stage 208, and an output stage 204.

In an example, the compare stage 206 can be configured to receive the DUT signal 130 from the DUT 124, such as via the loaded signal path 132, using the comparator input node 210. The compare stage 206 can receive the comparator reference signal 126 Vth using the reference signal input node 212. Generally, the compare stage 206 is configured to perform a signal comparison operation to determine which of the respective signals at the comparator input node 210 and the reference signal input node 212 has a greater or lesser signal amplitude characteristic, such as at a particular or specified time. A comparison result or output of the compare stage 206 can be provided to the first gain stage 202. In an example, the comparison result includes a differential signal or logic signal, that is, a signal having two signal components.

In an example, the compare stage 206 includes a differential amplifier that amplifies a differential voltage received at the comparator input node 210 and the reference signal input node 212, and suppresses common-mode signal components. Various other compare stage 206 circuits can be used, such as including one or more of the comparators described by McQuilkin in U.S. Pat. No. 9,813,050, titled "Comparator Circuit with Input Attenuator," which is hereby incorporated herein by reference in its entirety. The compare stage 206 decision circuit can include, among other things, a differential pair that reports when the DUT signal crosses the reference signal voltage Vth, but can also serve as a level shifter to allow the subsequent gain stages to operate below ground, such as to save power.

The first gain stage 202 can include various gain or amplifier circuitry. That is, the first gain stage 202 can include amplifier circuitry such as can include operational amplifiers or other arrangements or configurations of transistors or other circuitry to perform signal amplification or buffering. Multiple gain stage instances can be provided in series, such that each gain stage further amplifies or buffers an output of a preceding gain stage. In the example of FIG. 2, the first gain stage 202 provides a first gain stage output signal to one or more intermediate gain stages that, in turn, provide a gain stage output using a last or nth gain stage 208. The nth gain stage 208 can be configured to provide an output signal into a relatively high input impedance receiver in the output stage 204. In response, the output stage 204 can provide an output signal to a low impedance environment. The various gain stages, such as the first gain stage 202, the nth gain stage 208, and any one or more other gain stages, can be identically or differently configured.

In an example, the output stage 204 provides the differential comparator output signal 128 that includes first and second signal components Q and Qb at the first output node 214 and second output node 216, respectively. That is, the comparator stage output signal components can be used to provide a digital output signal indicative of a magnitude relationship between the input signals received at the comparator input node 210 and the reference signal input node 212.

In an example, any one or more of the compare stage 206, the first gain stage 202 through the nth gain stage 208, or the output stage 204 can include or use a compensation circuit to update or correct signal characteristics or errors in the DUI signal received at the comparator input node 210.

Figure 3:
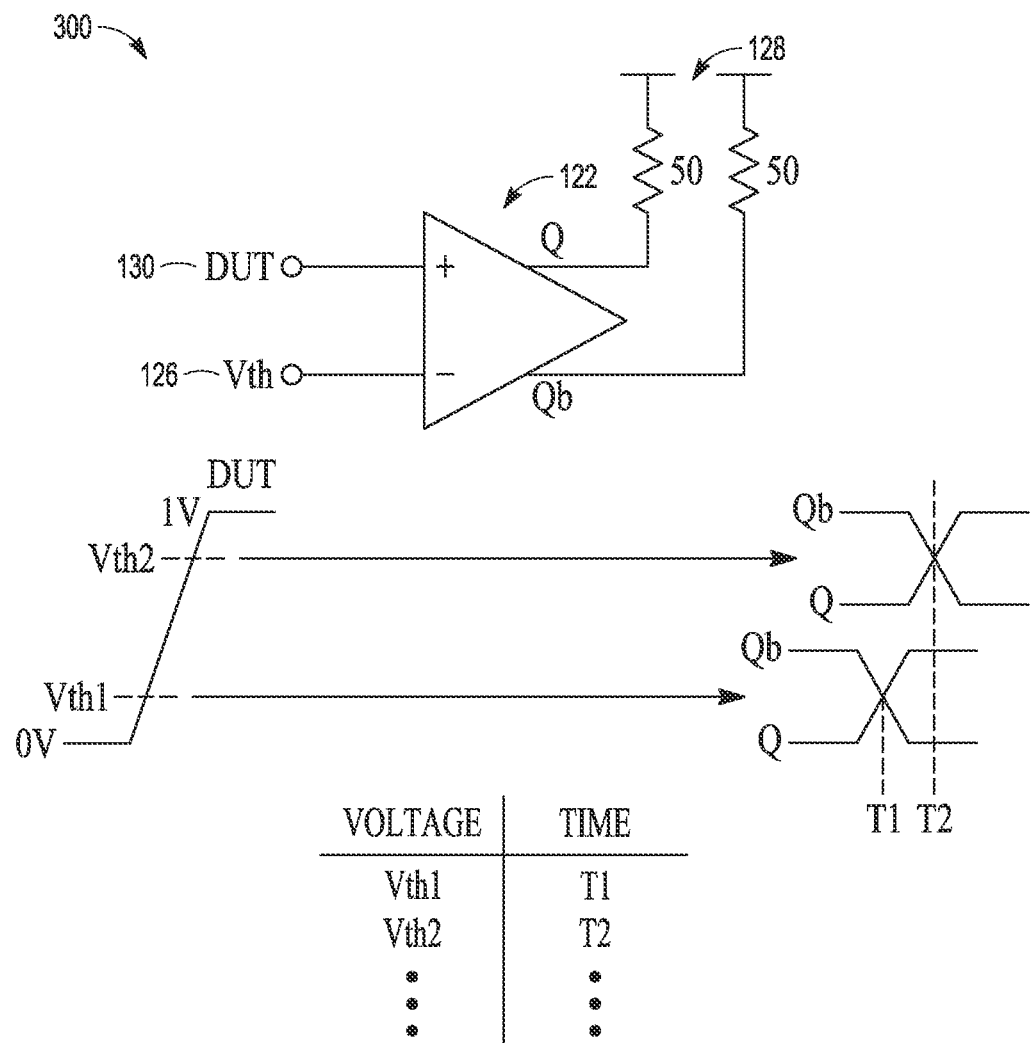
FIG. 3 illustrates generally an example of a comparator circuit and signal timing diagram.

FIG. 3 illustrates generally an example of a comparator diagram 300. The comparator diagram 300 includes a schematic representation of the comparator circuit 122 with inputs configured to receive the BUT signal 130 and the comparator reference signal 126, and an output configured to provide the differential comparator output signal 128 as the differential signals Q and Qb.

FIG. 3 further includes a signal timing diagram. In an example, the comparator circuit 122 can be considered an analog-to-digital converter that translates a time-varying analog input (e.g., the DUT signal 130) into a digital representation (e.g., the differential comparator output signal 128) based on a relationship between the input signal and a reference (e.g., the comparator reference signal 126 or Vth). In an ATE system, a comparator can be used to "digitize" time-dependent voltage signals from a DUT by decomposing the signals into time/voltage data pairs. An important high frequency (AC) performance metric for a comparator, therefore, is a constant, input invariant propagation delay to ensure the data pairs are known or predictable.

FIG. 3 shows an example of various time/voltage data pairs to demonstrate the effect of a propagation delay. The time/voltage data pairs can be measured by adjusting the threshold voltage and recording output crossing times. Assuming, for example, a DUT signal that transitions from zero to one volt, when Vth=Vth1 then the output crossing time occurs at T1, and when Vth=Vth2 then the output cross time occurs at T2. High resolution Vth increments, and input invariant propagation delay, can thus produce a faithful replica or digitization of the DUT signal. If propagation delay is variable or unpredictable, then actual time/voltage data pairs can deviate from known or expected values, which in turn can lead to an inaccurate representation of all or a portion of the DUT signal.

Figure 4:
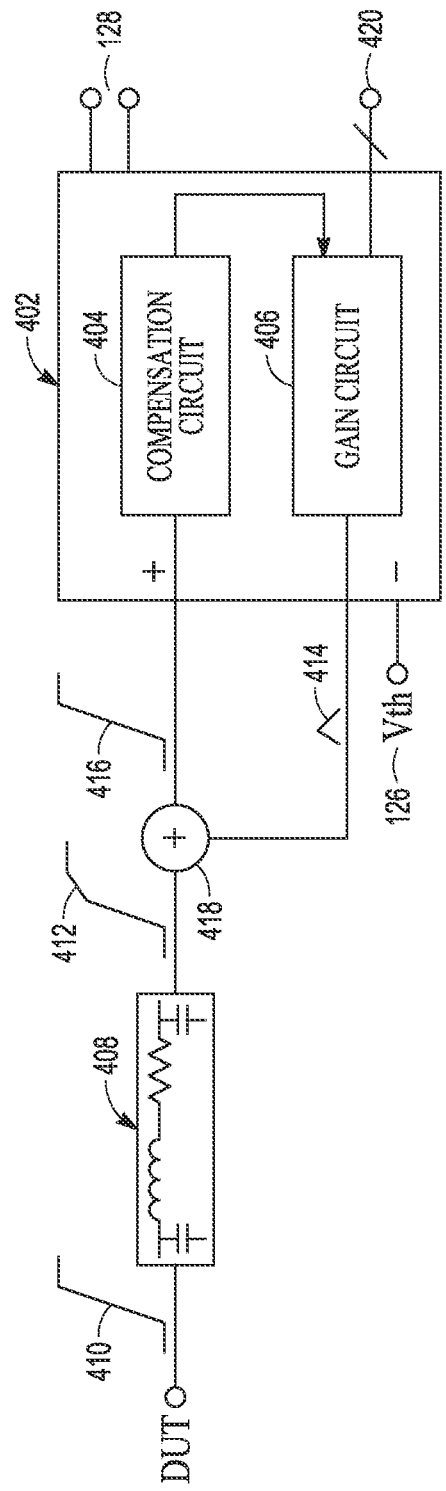
FIG. 4 illustrates generally an example of a comparator system with a non-ideal signal path.

FIG. 4 illustrates generally an example that includes a comparator system 402 and a non-ideal signal path. The comparator system 402 can be configured to provide the differential comparator output signal 128 based on a corrected DUI signal 416.

Non-ideal systems contend with various sources of signal corruption. For example, an ATE system contends with non-idealities in signal paths that extend between the DUT 124 and, e.g., an input node of the comparator circuit 122. Such non-idealities can exist on each of multiple different channels between the DUT 124 and the comparator circuit 122, and the non-ideal behavior can be different in each channel. Examples of non-idealities include skin effect losses, PCB board dielectric loading, transmission line resistance, and waveform reflections, among others, all which conspire to distort the true DUT waveform before the DUT signal can be operated on by the comparator circuit 122.

In the example of FIG. 4, the DUT signal generated at the DUT 124 can include a non-loaded, ideal DUT signal 410 that represents the true DUT waveform. The ideal DUT signal 410 can be provided to the comparator circuit 122 using a loaded signal path 408 that can introduce or cause various changes to the true DUT waveform resulting in the non-ideal or corrupted DUT signal 412. In an example, if the comparator system 402 receives and processes the corrupted DUT signal 412 then the differential comparator output signal 128 can include erroneous information.

Characteristics of the non-ideal or loaded signal path 408 can be measured, quantified, or characterized. For example, a frequency response of the loaded signal path 408 can be measured and S-parameters can be determined that describe the electrical behavior of the path. Such information about the loaded signal path 408 characteristics can be used to determine a signal filter, and the filter can be used to provide an inverse response signal, or compensation signal, that represents a deviation of the corrupted DUT signal 412 from the ideal DUT signal 410. That is, a compensation signal can include a signal with the inverse step response to the path loading response of the loaded signal path 408. The compensation signal can be summed with the corrupted DUT signal 412 to provide a corrected DUT signal 416, and the corrected DUT signal 416 can be used by the comparator system 402 to generate the differential comparator output signal 128.

In the example of FIG. 4, the comparator system 402 includes a compensation circuit 404 and a gain circuit 406. The compensation circuit 404 can include passive or active signal filter processing circuitry that is configured to represent the inverse response of the loaded signal path 408. That is, the compensation circuit 404 can be configured to generate a compensation signal that compensates for losses or changes in a particular signal when the particular signal is carried by the loaded signal path 408. Parameters of the compensation circuit 404 can be channel-specific and can optionally be adjusted by a user. In other words, the components or signal processing configuration of the compensation circuit 404 can be updated or adjusted to accommodate changes in the loaded signal path 408 between a DUT and the comparator system 402.

The gain circuit 406 can include an amplifier circuit that is configured to amplify or attenuate a magnitude of the compensation signal provided by the compensation circuit 404. In an example, the gain circuit 406 includes a digitally-controlled amplifier that is configured to receive a user-specified control signal at a compensation control node 420. The control signal can be used to adjust an amount of gain or attenuation provided by the gain circuit 406. An output node of the gain circuit 406 can provide a correction signal 414. In an example that includes multiple test signal channels, the gain circuit 406 can be configured to provide respective different levels of gain adjustment for each channel to correct for channel-specific losses.

In an example, the correction signal 414 represents a gain-adjusted version of the compensation signal from the compensation circuit 404. The correction signal 414 can be provided to a summing circuit 418 where the corrupted DUT signal 412 can be combined with the correction signal 414. The summing circuit 418 can thus provide the corrected DUT signal 416 based on a combination of the corrupted DUT signal 412 and the correction signal 414.

Figure 5:
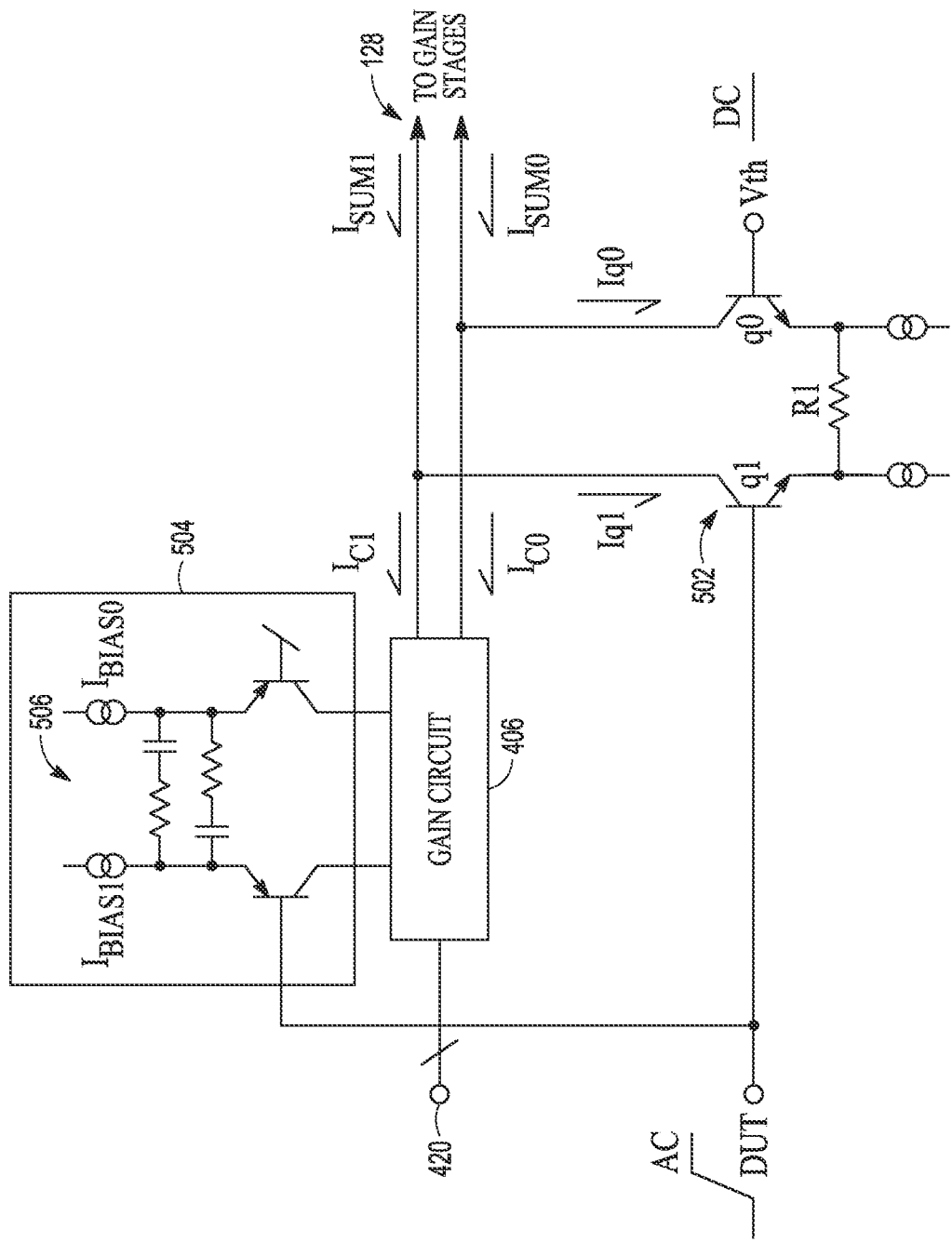
FIG. 5 illustrates generally an example of a portion of a comparator circuit that can include a first differential circuit and a first compensation circuit.

FIG. 5 illustrates generally an example of a portion of a comparator circuit that can include a first differential circuit 502 and a first compensation circuit 504. The first compensation circuit 504 can comprise an example of the compensation circuit 404. Outputs from the first differential circuit 502 and the first compensation circuit 504 can be combined to provide the differential comparator output signal 128, such as can be provided to subsequent gain stages in an ATE system.

In the example of FIG. 5, the comparator circuit includes a first differential circuit 502 configured to receive an AC DUT signal and, based on a magnitude relationship between the DUT signal and a DC reference voltage Vth, provide a differential output current signal. In the example of FIG. 5, the first differential circuit 502 comprises a differential pair of NPN transistors with a degeneration resistor R1. The differential pair is a transconductance circuit that converts the difference between the DUT voltage and the reference voltage to the differential output current signal comprising signals Iq1 and Iq0. Under ideal conditions, if the DUT signal and Vth are equal, then Iq1 and Iq0 can have equal current magnitude characteristics. If, under the same input conditions, Iq1 and Iq0 are unequal, then the amount by which they differ is considered an offset. Generally, it can be desirable for the comparator to exhibit little or no offset. In case offset exists, it can be desirable that such offset is constant and independent of input signal characteristics or gain settings.

In the example of FIG. 5, the first compensation circuit 504 is configured to receive the AC DUT signal. The first compensation circuit 504 can include a differential pair circuit to provide intermediate differential current signals that generally correspond to the differential signals Iq1 and Iq0 from the first differential circuit 502. The differential pair circuit in the first compensation circuit 504 can receive DC bias signals from current sources $I_{BIAS1}$ and $I_{BIAS0}$, and the first compensation circuit 504 can further include a first shaping filter 506, such as can be configured to influence AC signal coupling between legs of the differential pair circuit. In an example, in response to changes in the DUT signal, the differential pair can provide the intermediate differential current signals as a function of the first shaping filter 506. Stated differently, in response to changes in the received AC DUT signal, the differential pair in the first compensation circuit 504 can impose, on top of the DC bias signals, a waveform or signal component(s) that depends on the first shaping filter 506. Accordingly, the intermediate differential current signals can comprise DC-coupled signals, as well as AC components, provided by the first compensation circuit 504.

The comparator circuit can further include an instance of the gain circuit 406, such as can be configured by a control signal at the compensation control node 420. In the example of FIG. 5, the gain circuit 406 can receive the intermediate differential current signals from the first compensation circuit 504 and provide gain-adjusted differential compensation signals $I_{C1}$ and $I_{c0}$. The gain-adjusted differential compensation signals can be combined with the differential signals Iq1 and Iq0 from the first differential circuit 502 to provide corrected differential output signals $I_{SUM1}$ and $I_{SUM0}$.

The first compensation circuit 504 output thus includes a superposition of an AC compensation component (e.g., generated using the first shaping filter 506) and a DC compensation component from the DC bias signals from the current sources $I_{BIAS1}$ and $I_{BIAS0}$. The gain circuit 406 receives the output from the first compensation circuit 504 and operates on the AC and DC compensation components to provide the compensation signals $I_{C1}$ and $I_{C0}$. The present inventors have recognized that a problem with the circuit of FIG. 5 can include the potential for introducing offset in the compensation signals $I_{C1}$ and $I_{C0}$ and therefore the output signals $I_{SUM1}$ and $I_{SUM0}$.

For example, if the first compensation circuit 504 provides the intermediate differential current signals without an AC component (e.g., because the DUT signal matches the threshold voltage), then the intermediate differential current signals comprise only DC components due to the DC bias signals from the current sources $I_{BIAS1}$ and $I_{BIAS0}$. The gain circuit 406 can receive and operate on the intermediate differential current signals to provide the compensation signals $I_{C1}$ and $I_{C0}$. If the gain circuit 406 is not ideal, then offset errors can be introduced in the compensation signals $I_{C1}$ and $I_{C0}$. The result is a gain circuit 406 control-dependent offset, which can be undesirable.

A solution to the offset problem can include providing physically large, high-precision gain elements. However, such physically large components can compromise bandwidth and other performance characteristics. Another solution can include calibrating the gain circuit 406 for each input code at the compensation control node 420 and for each corresponding test condition or each DUT type. In an example, the calibration can include generating a correction signal with a magnitude that depends on an amount of mismatch between the compensation signals $I_{C1}$ and $I_{C0}$ for each input code at the compensation control node 420. However, such calibration can be time consuming, expensive, and impractical. For example, such calibration may not account for correction signal drift over time and temperature. A different solution can include separately generating and processing AC and DC components of a correction signal, to help avoid the effects of control-dependent offset.

Figure 6:
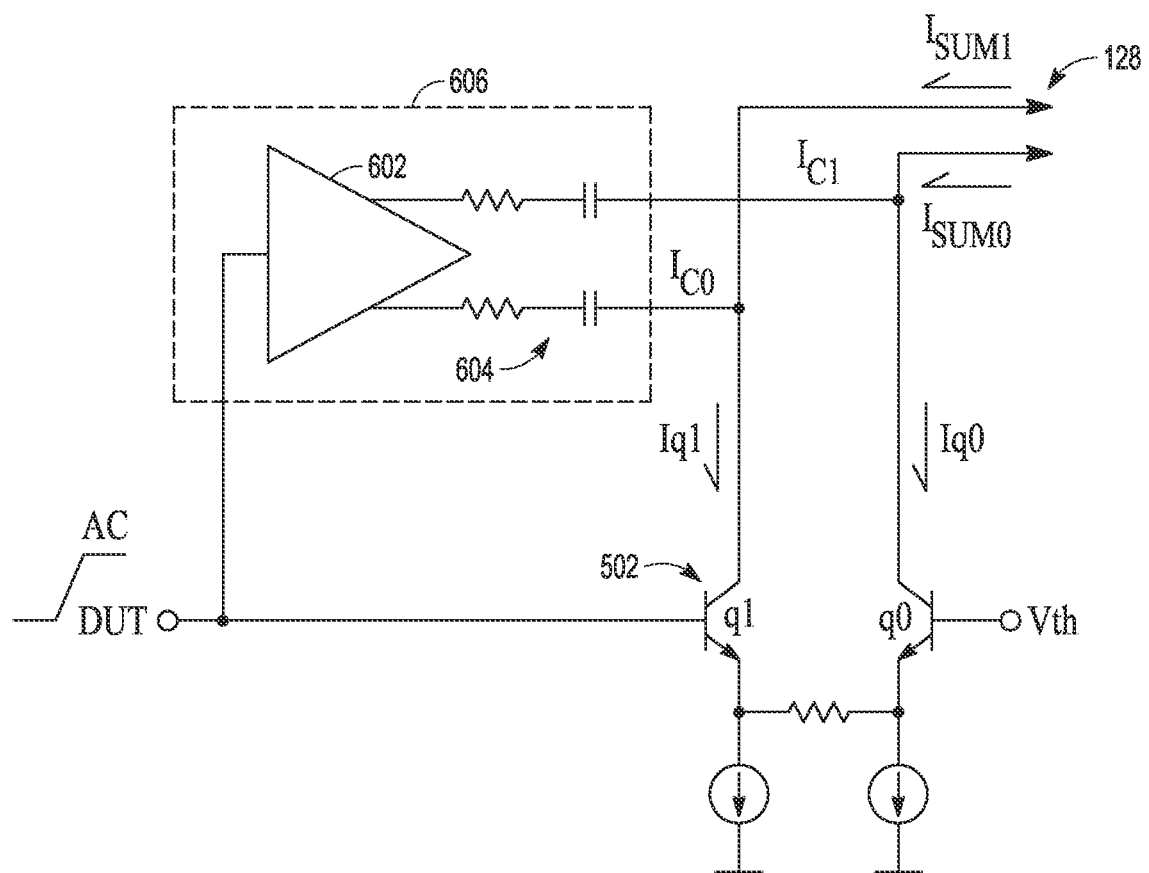
FIG. 6 illustrates generally an example of a comparator circuit with a second compensation circuit.

FIG. 6 illustrates generally an example of a comparator circuit with a second compensation circuit 606. The second compensation circuit 606 can comprise an example of the compensation circuit 404. Output current signals Iq1 and Iq0 from the first differential circuit 502 and output current signals $I_{C1}$ and $I_{c0}$ from the second compensation circuit 606 can be respectively combined to provide the differential comparator output signal 128, such as can be provided to subsequent gain stages in an ATE system.

In the example of FIG. 6, the second compensation circuit 606 comprises a buffer circuit 602 and a second shaping filter 604. The buffer circuit 602 can be configured to monitor or receive the DUT signal from the DUT and, optionally, adjust a magnitude characteristic of the signal. The buffer circuit 602 can feed differential output signals to the second shaping filter 604 that, in turn, can provide the compensation signals $I_{C1}$ and $I_{c0}$. The buffer circuit 602 can optionally include a unity gain buffer or, in some examples, can be omitted from the second compensation circuit 606.

Figure 7:
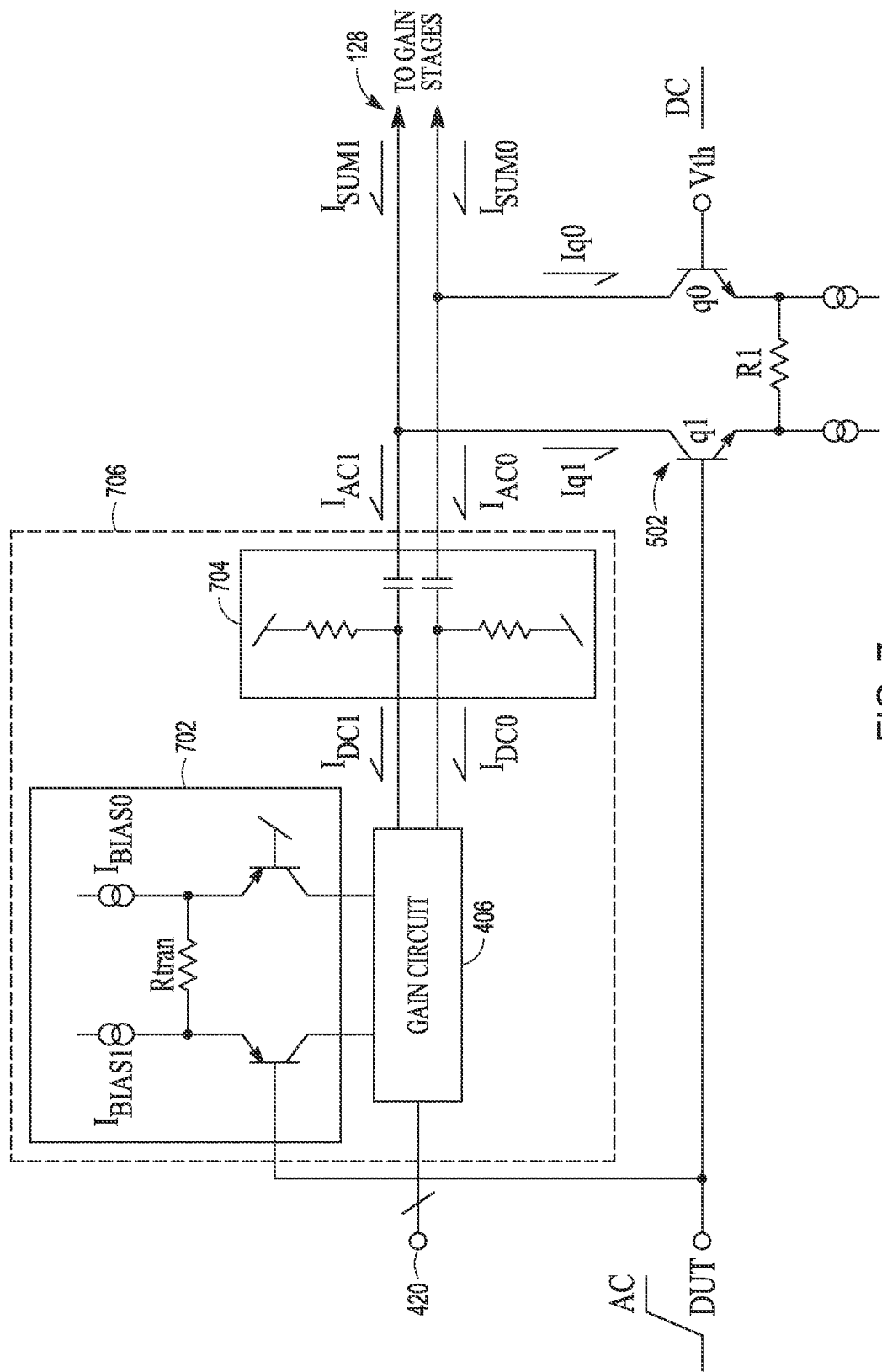
FIG. 7 illustrates generally an example of a comparator circuit with a third compensation circuit.

FIG. 7 illustrates generally an example of a comparator circuit with a third compensation circuit 706. The third compensation circuit 706 can comprise an example of the compensation circuit 404 or one or more portions thereof. In the example of FIG. 7, output current signals Iq1 and Iq0 from the first differential circuit 502 and output current signals $I_{AC1}$ and $I_{AC0}$ from the third compensation circuit 706 can be respectively combined to provide the differential comparator output signal 128, such as can be provided to subsequent gain stages in an ATE system.

The third compensation circuit 706 can include, among other things, a transconductance circuit 702 and a third shaping filter 704. The third compensation circuit 706 can optionally include, or can be coupled to, the gain circuit 406.

The transconduaance circuit 702 can be configured to receive the DUT signal 130 and, in response, provide differential DC-coupled signals that represent the DUT signal 130. That is, the transconductance circuit 702 can be configured to generate a DC-coupled current waveform that represents AC voltage characteristics of the DUT signal 130, and can further represent, or include information about, DC characteristics of the DUT signal 130 relative to the threshold voltage Vth. In an example, the transconductance circuit 702 can include a degeneration resistor (e.g., Rtran) but can omit other signal processing or AC signal-shaping filtering.

The DC-coupled signals can be received and processed by the gain circuit 406, such as according to a control signal received at the compensation control node 420, to provide gain-adjusted, intermediate compensation signals $I_{DC1}$ and $I_{DC0}$. The intermediate compensation signals can thus comprise an amplified or attenuated analog of the voltage of the DUT signal 130. Due to imperfections in the gain circuit 406, DC mismatches or errors can be included in the intermediate compensation signals $I_{DC1}$ and $I_{DC0}$. However, those DC error components can be removed or blocked, for example, using the third shaping filter 704.

The third shaping filter 704 can receive the intermediate compensation signals $I_{DC1}$ and $I_{DC0}$ and, in response, provide differential correction signals $I_{AC1}$ and $I_{AC0}$. That is, the third shaping filter 704 can receive a differential input, such as the intermediate compensation signals $I_{DC1}$ and $I_{DC0}$, which may include DC-coupled errors that can be blocked by the third shaping filter 704. The third shaping filter 704 can further be configured to extract AC-coupled components that represent, or are a function of, signal losses such as due to the loaded signal path 408. In other words, the differential correction signals provided by the third shaping filter 704 can include AC-coupled components that can be used to correct errors that may exist in the output current signals Iq1 and Iq0 from the first differential circuit 502 and thus correct for loading path errors or losses. The differential correction signals can be respectively combined with the differential signals Iq1 and Iq0 from the first differential circuit 502 to provide the differential comparator output signal 128 such as comprising differential components $I_{SUM1}$ and $I_{SUM0}$.

In an example, the third shaping filter 704 comprises various passive or active filtering or signal processing circuitry. The characteristics of the filter, and the AC-coupled components it generates, can be fixed or can be adjustable, such as in response to a user input. In an example, the third shaping filter 704 can include a control circuit that updates or adjusts various impedance characteristics or component values that comprise the filter. In an example, one or more components or values of the filter can be based in part on a characteristic of the DUT signal 130, such as a magnitude or frequency of the DUT signal 130.

Figure 8:
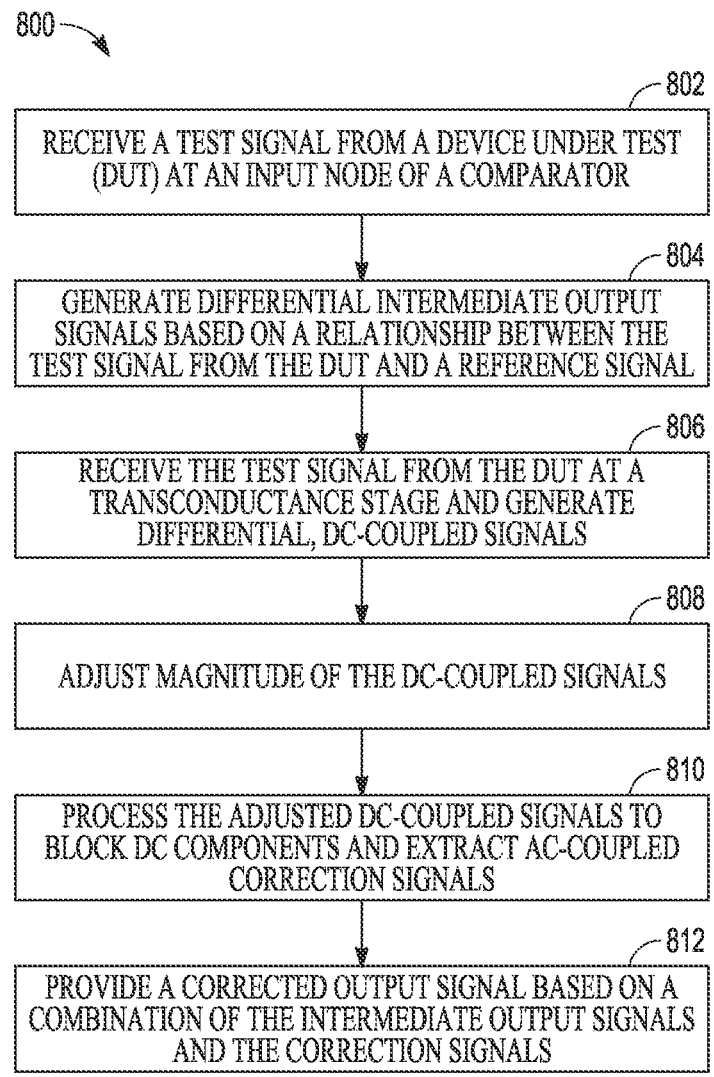
FIG. 8 illustrates generally an example of a method that can include providing a corrected comparator output using a compensation circuit.

FIG. 8 illustrates generally an example of a method 800 that can include providing a corrected comparator output using a residue generator or compensation circuit. At block 802, the method 800 can include receiving a test signal from a DUT at an input node of a comparator circuit or comparator system. In an example, block 802 can include receiving the DUT signal 130 via the loaded signal path 132.

At block 804, the method 800 can include generating differential intermediate output signals (e.g., Iq1 and Iq0) that are based on a relationship between the received test signal and a comparator reference signal. The intermediate output signal can be uncorrected. That is, the intermediate output signal can include various timing or offset errors that can be due, at least in part, to distortion in the received DUT signal 130.

At block 806, the method 800 can include receiving the test signal at a transconductance stage and, in response, providing corresponding, differential DC-coupled signals. At block 808, the method 800 can include receiving the DC-coupled signals at an amplifier circuit and buffering or adjusting a magnitude of the DC-coupled signals. At block 810, the buffered or magnitude-adjusted DC-coupled signals can be received by a filter circuit and processed. The filter circuit can be configured to block DC-coupled components of the DC-coupled signals and extract AC-coupled correction signals.

At block 812, the method 800 can include providing the corrected comparator output based on a combination of the intermediate output signals e.g., from block 804) and the AC-coupled correction signals. That is, block 812 can include summing respective components of the differential intermediate output signals with components of the AC-coupled correction signals to provide a differential comparator output that compensates for path losses or distortions in the DUT signal 130, and is therefore resistant to timing or offset errors.

Various aspects of the present disclosure can help provide a solution to the test system-related problems identified herein. In an example, Aspect 1 can include a method comprising: receiving a test signal from a device under test (DUT) at an input node of a comparator; generating an intermediate output signal based on a relationship between the test signal from the DUT and a comparator reference signal; providing a DC-coupled signal based on the relationship between the test signal from the DUT and the comparator reference signal; generating an AC-coupled correction signal using the DC-coupled signal, the correction signal complementary to a portion of the received test signal; and providing a corrected output signal based on a combination of the intermediate output signal and the correction signal.

In Aspect 2, the subject matter of Aspect 1 can include generating the correction signal including processing the received test signal from the DUT using a filter, wherein the filter is configured to compensate for conductor path losses between the DUT and the input node.

In Aspect 3, the subject matter of any one or more of Aspects 1-2 can include generating the correction signal including applying a signal filter to the received test signal from the DUT, wherein a time constant characteristic of the signal filter is based on a loading characteristic of a signal path coupled to the input node of the comparator.

In Aspect 4, the subject matter of any one or more of Aspects 1-3 can include generating the correction signal including processing the received test signal from the DUT using a gain stage and a shaping filter.

In Aspect 5, the subject matter of any one or more of Aspects 1-4 can include providing the DC-coupled signal including: receiving the test signal from the DUT at a transconductance stage and generating a corresponding DC-coupled residue, and processing the DC-coupled residue using a gain stage to provide the DC-coupled signal.

In Aspect 6, the subject matter of Aspect 5 can include generating the DC-coupled residue including: updating a bias signal or an AC coupling characteristic of a differential pair circuit; and processing the test signal from the DUT using the differential pair circuit.

In Aspect 7, the subject matter of any one or more of Aspects 5-6 can include changing a magnitude of the DC-coupled residue in the gain stage.

In Aspect 8, the subject matter of Aspect 7 can include receiving information about the DUT (e.g., about a type of kind of DUT) and, based on a priori information about the DUT itself, changing the magnitude of the DC-coupled residue in the gain stage based on the received information about the DUT.

In Aspect 9, the subject matter of any one or more of Aspects 5-8 can include providing the DC-coupled signal including extracting, from the DC-coupled signal, an AC component that is based on a loading characteristic of a signal path at the input node of the comparator.

In Aspect 10, the subject matter of any one or more of Aspects 1-9 can include generating the intermediate output signal using a differential pair circuit to provide information about the relationship between the test signal and the comparator reference signal.

Aspect 11 can include or use a system for monitoring information from a device under test (DUI), the system comprising: a DUT input node configured to receive a test signal from a DUT via a first signal path; a comparator circuit coupled to the DUT input node and configured to generate an intermediate output signal based on a relationship between the test signal from the DUT and a comparator reference signal; a compensation circuit coupled to the DUT input node and configured to generate a correction signal to compensate for a portion of the received test signal; and an output circuit configured to provide a corrected output signal based on a combination of the intermediate output signal and the correction signal.

In Aspect 12, the subject matter of Aspect 11 can include the output circuit configured to sum the intermediate output signal and the correction signal to provide the corrected output signal.

In Aspect 13, the subject matter of any one or more of Aspects 11-12 can include the compensation circuit compromising a shaping filter configured to compensate for loading effects of the first signal path.

In Aspect 14, the subject matter of Aspect 13 can include the compensation circuit such as can further include a gain circuit and the shaping filter can be configured to block a DC component of an output from the gain circuit.

In Aspect 15, the subject matter of any one or more of Aspects 13-14 can include the compensation circuit such as can further include a transconductance stage configured to receive voltage information about the test signal and, in response, provide a corresponding DC-coupled current signal to the shaping filter.

In Aspect 16, the subject matter of Aspect 15 can include an amplifier circuit configured to change (e.g., amplify or attenuate) an amplitude characteristic of the current signal provided to the shaping filter.

In Aspect 17, the subject matter of Aspect 16 can include the amplifier circuit configured to change the amplitude characteristic of the current signal based on information from a user input about a particular device under test.

In Aspect 18, the subject matter of any one or more of Aspects 15-17 can include an adjustable bias circuit of the transconductance stage, wherein a magnitude of the current signal depends on bias conditions set by the adjustable bias circuit to accommodate a particular device under test.

Aspect 19 can include or use a test system comprising: a first differential pair circuit configured to generate an intermediate output signal based on a relationship between a test signal received from a device under test (DUI) and a reference signal; a path loading compensation circuit configured to generate an AC-coupled correction signal complementary to a portion of the received test signal, wherein the compensation circuit comprises a transconductance stage configured to provide a DC-coupled intermediate signal to a gain stage, and a signal shaping filter stage configured to provide the correction signal based on an output signal from the gain stage; and an output circuit configured to provide a corrected output signal based on a combination of the intermediate output signal and the correction signal.

In Aspect 20, the subject matter of Aspect 19 can include the gain stage configured to receive a control signal that indicates a desired magnitude characteristic of the correction signal for a particular device under test.

Aspect 21 is at least one machine-readable medium including instructions that, when executed by processing circuitry, cause the processing circuitry to perform operations to implement of any of one or more of Aspects 1-20 or a portion thereof.

Aspect 22 is an apparatus comprising means to implement of any one or more of Aspects 1-20.

Aspect 23 is a system to implement of any one or more of Aspects 1-20.

Aspect 24 is a method to implement of any one or more of Aspects 1-20.

Each of these non-limiting Aspects can stand on its own, or can be combined in various permutations or combinations with one or more of the other Aspects, examples, or features discussed elsewhere herein.

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods or circuit operations or circuit configuration instructions as described in the above examples. An implementation of such methods can include code, such as microcode, assembly language code, a higher-level language code, or the like. Such code can include computer readable instructions for performing various methods, The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method comprising:
   receiving a test signal from a device under test (DUT) at an input node of a comparator;
   generating an intermediate output signal based on a relationship between the test signal from the DUT and a comparator reference signal;
   providing a DC-coupled signal based on the relationship between the test signal from the DUT and the comparator reference signal;
   generating an AC-coupled correction signal using the DC-coupled signal, the correction signal complementary to a portion of the received test signal; and
   providing a corrected output signal based on a combination of the intermediate output signal and the correction signal.

2. The method of claim 1, wherein generating the correction signal comprises processing the received test signal from the DUT using a filter, wherein the filter is configured to compensate for conductor path losses between the DUI and the input node.

3. The method of claim 1, wherein generating the correction signal comprises applying a signal filter to the received test signal from the DUT, wherein a time constant characteristic of the signal filter is based on a loading characteristic of a signal path coupled to the input node of the comparator.

4. The method of claim 1, wherein generating the correction signal comprises processing the received test signal from the DUT using a gain stage and a shaping filter.

5. The method of claim 1, wherein providing the DC-coupled signal includes:
   receiving the test signal from the DUT at a transconductance stage and generating a corresponding DC-coupled residue, and processing the DC-coupled residue using a gain stage to provide the DC-coupled signal.

6. The method of claim 5, wherein generating the DC-coupled residue includes:
   updating a bias signal or an AC coupling characteristic of a differential pair circuit; and
   processing the test signal from the DUT using the differential pair circuit.

7. The method of claim 5, further comprising changing a magnitude of the DC-coupled residue in the gain stage.

8. The method of claim 7, further comprising receiving information about the DUT and changing the magnitude of the DC-coupled residue in the gain stage based on the received information about the DUI.

9. The method of claim 5, wherein providing the DC-coupled signal includes extracting, from the DC-coupled signal, an AC component that is based on a loading characteristic of a signal path at the input node of the comparator.

10. The method of claim 1, wherein generating the intermediate output signal includes using a differential pair circuit to provide information about the relationship between the test signal and the comparator reference signal.

11. A system for monitoring information from a device under test (DUT), the system comprising:
    a DUT input node configured to receive a test signal from a DUT via a. first signal path;
    a comparator circuit coupled to the NIT input node and configured to generate an intermediate output signal based on a relationship between the test signal from the DUT and a comparator reference signal;
    a compensation circuit coupled to the DUT input node and configured to generate a correction signal to compensate for a portion of the received test signal; and
    an output circuit configured to provide a corrected output signal based on a combination of the intermediate output signal and the correction signal.

12. The system of claim 11, wherein the output circuit is configured to sum the intermediate output signal and the correction signal to provide the corrected. output signal.

13. The system of claim 11, wherein the compensation circuit comprises a shaping filter configured to compensate for loading effects of the first signal path.

14. The system of claim 13, wherein the compensation circuit further comprises a gain circuit and the shaping filter is configured to block a DC component of an output from the gain circuit.

15. The system of claim 13, wherein the compensation circuit further comprises a transconductance stage configured to receive voltage information about the test signal and, in response, provide a corresponding DC-coupled current signal to the shaping filter.

16. The system of claim 15, further comprising an amplifier circuit configured to change an amplitude characteristic of the current signal provided to the shaping filter.

17. The system of claim 16, wherein the amplifier circuit is configured to change the amplitude characteristic of the current signal based on information from a user input about a particular device under test.

18. The system of claim 15, further comprising an adjustable bias circuit of the transconductance stage, wherein a magnitude of the current signal depends on bias conditions set by the adjustable bias circuit to accommodate a particular device under test.

19. A test system comprising:
    a first differential pair circuit configured to generate an intermediate output signal based on a relationship between a test signal received from a device under test (DUT) and a reference signal;
    a path loading compensation circuit configured to generate an AC-coupled correction signal complementary to a portion of the received test signal, wherein the compensation circuit comprises a transconductance stage configured to provide a DC-coupled intermediate signal to a gain stage, and a signal shaping filter stage configured to provide the correction signal based on an output signal from the gain stage; and
    an output circuit configured to provide a corrected output signal based on a combination of the intermediate output signal and the correction signal.

20. The test system of claim 19, wherein the gain stage is configured to receive a control signal that indicates a desired magnitude characteristic of the correction signal for a particular device under test.

* * * * *

UNITED STATES PATENT AND TRADEMARK OFFICE
CERTIFICATE OF CORRECTION

| | | |
|---|---|---|
| PATENT NO. | : 11,686,773 B1 | |
| APPLICATION NO. | : 17/584211 | |
| DATED | : June 27, 2023 | |
| INVENTOR(S) | : McQuilkin et al. | |

It is certified that error appears in the above-identified patent and that said Letters Patent is hereby corrected as shown below:

On the Title Page

In item (57), in "Abstract", in Column 2, Line 2, delete "(DUI)" and insert --(DUT)-- therefor In the Claims In Column 15, Line 28, in Claim 2, delete "DUI" and insert --DUT-- therefor In Column 15, Line 56, in Claim 8, delete "DUI." and insert --DUT.-- therefor In Column 16, Line 4, in Claim 11, delete "a." and insert --a-- therefor In Column 16, Line 5, in Claim 11, delete "NIT" and insert --DUT-- therefor In Column 16, Line 18, in Claim 12, delete "corrected." and insert --corrected-- therefor Signed and Sealed this
Fifteenth Day of October, 2024

*Katherine Kelly Vidal*

Katherine Kelly Vidal
*Director of the United States Patent and Trademark Office*